United States Patent [19]
Burr et al.

[11] Patent Number: 5,753,958
[45] Date of Patent: May 19, 1998

[54] BACK-BIASING IN ASYMMETRIC MOS DEVICES

[75] Inventors: James B. Burr, Foster City; Douglas Alan Laird, Los Gatos, both of Calif.

[73] Assignee: Sun Microsystems, Inc., Mt. View, Calif.

[21] Appl. No.: 543,485

[22] Filed: Oct. 16, 1995

[51] Int. Cl.$^6$ .......................... H01L 29/76; H01L 29/94; H01L 31/113; H01L 31/062
[52] U.S. Cl. .......................... 257/392; 257/345; 257/386; 257/391; 257/402; 257/403; 257/404
[58] Field of Search .......................... 257/335, 339, 257/345, 386, 391, 392, 403, 404, 402

[56] References Cited

U.S. PATENT DOCUMENTS

| | | |
|---|---|---|
| 4,300,150 | 11/1981 | Colak . |
| 4,939,571 | 7/1990 | Nishizawa et al. . |
| 4,949,140 | 8/1990 | Tam . |
| 5,304,827 | 4/1994 | Malhi et al. ............... 257/262 |
| 5,386,136 | 1/1995 | Williams et al. ........... 257/409 |

OTHER PUBLICATIONS

Yan, R. H.; Lee, K. F.; Jeon, D. Y.; Kim, Y. O.; Park, B. G.; Pinto, M. R.; Rafferty, C. S.; Tennant, D. M.; Westerwick, E. H.; Chin, G. M.; Morris, M.D.; Early, K.; Mulgrew, P.; Mansfield, W. M.; Watts, R. K.; Voshchenkov, A. M.; Bokor, J.; Swartz, R. G.; and Ourmazd, A.; "High Performance 0.1-μm Room Temperature Si MOSFETs", Symposium on VLSI Technology Digest of Technical Papers, pp. 86–87, 1992.

Aoki, M.; Ishii, T.; Yoshimura, T.; Iiiyima, S.; Yamanaka, T.; Kure, T.; Ohyu, K.; Shimohigashi, K.; "0.1 μm CMOS Devices Using Low–Impurity Channel Transistors (LICT)", pp. 9.8.1 – 9.8.3, IEDM, 1987.

Yoshimura, Hisao; Matsuoka, Fumitomo; and Masakaru, Kakumu "New CMOS Shallow Junction Well FET Structure (CMOS-SJET) for Low Power–Supply Voltage", Semiconductor Device Engineering Laboratory, Japan, Proceedings of IEDM (1992), pp. 909–912.

Burr, Jim; "Stanford Ultra Low Power CMOS Technology", *NASA VLSI Design Symposium*, pp. 4.2.1–4.2.13, 1991..

Burr, Jim; "Stanford Ultra Low Power CMOS", Symposium Record, Hot Chips. V, pp. 7.4.1–7.4.12, Stanford, CA, 1993.

Burr, James B, and Peterson, Allen M.; "Energy Considerations in Multichip–Module Multiprocessors", *IEEE International Conference on Computer Design*, pp. 593–600, 1991.

"A New Lease on Life for Old–Fashioned Chips", Business Week, Science and Technology, p. 100, Dec. 20, 1993.

Burr, James B., and Scott, John, "A 200m V Self–Testing Encoder/Decoder using Stanford Ultra–Low Power CMOS", IEEE International Solid–State Circuits Conference, 1994.

Notes from Dr. Burr's dinner meeting with Hitachi employee.

Okumura, Yoshinori; Shirahata, Masayoshi; Hachisuka, Atsushi; Okudaira, Tomonori; Arima, Hideaki; and Matsukawa, Takayuki; "Source–to–Drain Nonuniformly Doped Channel (NUDC) MOSFET Structures for High Current Drivability and Threshold Voltage Controllability", pp. 2541–2552, IEEE Transaction on Electron Devices, vol. 39, No. 11, Nov. 1992.

(List continued on next page.)

*Primary Examiner*—Ngân V. Ngô
*Attorney, Agent, or Firm*—Beyer & Weaver, LLP

[57] ABSTRACT

An adjustable threshold voltage MOS device having an asymmetric pocket region is disclosed herein. The pocket region abuts one of a source or drain proximate the device's channel region. The pocket region has the same conductivity type as the device's bulk (albeit at a higher dopant concentration) and, of course, the opposite conductivity type as the device's source and drain. An MOS device having such pocket region may have its threshold voltage adjusted by applying a potential directly to its pocket region. This capability is realized by providing a contact or conductive tie electrically coupled to the pocket region. This "pocket tie" is also electrically coupled to a metallization line (external to the device) which can be held at a specified potential corresponding to a potential required to back-bias the device by a specified amount.

23 Claims, 8 Drawing Sheets

OTHER PUBLICATIONS

Sai–Halasz, George A.; Wordeman, Matthew R.; Kern, D.P.; Rishton, S.; and Ganin, E. "High Transconductance and Velocity Overshoot in NMOS Devices at the 0.1 µm Gate–Length Level", pp. 464–466, IEEE Electron Device Letters, vol. 9, No. 9, Sep. 1988.

Jayaraman, R.; Rumennik, V.; Singer, B. and Stupp, E.H., "Comparison of High Voltage Devices for Power Integrated Circuits," pp. 258–261, CH2099–0/84/0000–0258, IEDM 1984.

Tanaka, Junko; Kimura, Shin'ichiro, Noda, Hiromasa, Toyabe, Toru, and Ihara, Sigeo, "A Sub–0.1–µm Grooved Gate MOSFET with High Immunity to Short–Channel Effects," pp. 537–540, IEEE Transaction on Electionic Device, vol. 42, No. 3, Mar. 1995.

Huang, Wen–Ling Margaret, Klein, Kevin M., Grimaldi, M., Racanelli, Marco, Ramaswami, Shri, Taso, J., Foerstner, Juergen, and Hwang, Bor–Yuan C., Member IEEE, "TFSOI Complementary BiCMOS Technology for Low Power Applications," pp. 506–512, IEEE Transaction on Electronic Devices, vol. 42, No. 3, March 1995.

BACK-BIASING IN ASYMMETRIC MOS DEVICES

CROSS-REFERENCE TO RELATED APPLICATIONS

This application is related to U.S. patent application Ser. No. 08/357,436, filed Dec. 16, 1994, entitled ASYMMETRIC LOW POWER MOS DEVICES, and naming Burr and Brassington as inventors. That application is incorporated herein by reference in its entirety for all purposes.

BACKGROUND OF THE INVENTION

The present invention generally relates to methods and apparatus for controlling the threshold voltage of an asymmetric MOS device having a pocket region of increased dopant concentration abutting the device's source or drain. More specifically, the invention relates to a new approach to back-biasing an asymmetric MOS device, and thereby controlling the device's threshold voltage.

It has been proposed that a new class of MOS devices having low threshold voltages and asymmetric halo regions might have much faster switching speeds than conventional devices. Such asymmetric devices are shown in FIG. 1a and described in U.S. patent application Ser. No. 08/357,436 which was previously incorporated herein by reference. In general, such devices include—in addition to conventional MOS device elements—a pocket region containing a relatively high concentration of dopant abutting either the device's source or its drain along the side of the source or drain that faces the device's channel region. The pocket region dopant is of the same conductivity type as the dopant in the device's bulk region (albeit at a substantially higher concentration). Because the pocket region abuts only one of the source or drain, the device is deemed to be "asymmetric."

Both the low threshold voltage and the pocket region contribute to the improved performance of these devices. Regarding low threshold voltage, the maximum frequency $f_{max}$ of circuits comprised of MOS devices is a function supply voltage ("Vdd") and threshold voltage ("Vt") of the component devices. In general, as threshold voltage is lowered, circuit performance ($f_{max}$) improves. The maximum frequency of circuits comprised of truly long channel devices (having channel lengths of greater than about 2 μm) is given by the following expression:

$$f_{max} \propto (V_{dd}-V_t)^2/V_{dd}$$

The same parameter for circuits comprised of truly short channel devices (having channel lengths of less than about 1 μm) is given by the following expression:

$$f_{max} \propto (V_{dd}-V_t)/V_{dd}=1-V_t/V_{dd}$$

Most circuits exhibit some long and short channel effects. Regardless of which effects predominate, lower Vt translates to higher performance.

Regarding the effect of a pocket implant, it is believed that such implant, under the right conditions, greatly increases the velocity of some electrons when the device is switched on. Specifically, it is believed that asymmetric devices behave like two pseudo-MOS devices in series: a "source FET" and a "drain FET." The pocket region imparts a higher threshold voltage to the pseudo-device on its side of the transistor. Further, the pocket region is designed so that its corresponding pseudo-device has an extremely short effective channel length. For example, if the pocket region is on the source side of an MOS device, that device's source FET will have a higher threshold voltage and shorter channel length than the device's drain FET. An asymmetric MOS device having such structure is believed to operate as follows. Initially, at very low gate voltage, neither the shorter nor longer channel pseudo-device has switched "on." That is, neither pseudo-device's channel region has undergone inversion. As the gate voltage increases, it reaches the threshold of the longer channel pseudo-device, and that device switches on. However, the gate voltage still has not reached the level at which the shorter channel pseudo-device switches on, and no current flows through the device. As the gate voltage further increases and surpasses the shorter channel pseudo-device's threshold voltage, that device also switches on—and hence the device as a whole switches on.

If the asymmetric MOS devices are operated such that the gate voltage only slightly exceeds the threshold voltage of the shorter channel pseudo-device, the performance of the overall MOS device will be governed by the performance of that pseudo-device. This is very desirable if the shorter channel pseudo device has an effective channel length on the order of 500 Å or less. At such short lengths, some charge carriers are ballistically transported across the channel, or at least the scattering probability is higher than steady state due to the small number of scattering sites in the ultra-short source channel. Because ballistic transport occurs without scattering, carriers can reach much higher velocities than conventional phonon-mediated transport which relies on interactions between the charge carriers and the phonons of the semiconductor lattice atoms.

Asymmetric devices have been proposed before in various references such as A. Jayaraman et al., "COMPARISON OF HIGH VOLTAGE DEVICES FOR POWER INTEGRATED CIRCUITS" IEDM pp. 258–264 (1984). However, the devices described in these articles had, among other problems, threshold voltages which were too high to realize significant performance improvements. That is, by the time the source-FET turns on, the drain voltage is so high that the effective resistance of the drain limits the drive current of the overall device. Thus, to improve on the state of the art, it is critical that asymmetric devices be designed to have low threshold voltages—typically on the order of 0 to 100 millivolts for the shorter channel pseudo-device.

Unfortunately, it can be difficult to consistently attain such low thresholds in practice. First, the exact dopant concentration in the channel region can vary slightly from device to device due to processing variations. Although these variations may be slight, they can shift a device's threshold voltage by a few tens or even hundreds of millivolts (to outside of the desired range of operation). This problem is particularly acute when the dopant concentration in the channel region is relatively high due to a pocket region which extends into the channel region or to counterdoping in channel region. Both of these features are recommended for the asymmetric devices described in U.S. patent application Ser. No. 08/357,436 previously incorporated by reference. Further, environmental factors such as operating temperature fluctuations can shift the threshold voltage by a few tens of millivolts. While such low threshold voltage fluctuations may not present a problem for high threshold voltage devices, they do present a real problem for lower threshold devices which can have their operating characteristics severely altered by a threshold shift of a few millivolts.

To address these problems in low threshold devices generally, it has previously been proposed to use "back-biasing" to electrically tune threshold voltage. An article (James B. Burr, "Stanford Ultra Low Power CMOS," Symposium Record, Hot Chips V, pp. 7.4.1–7.4.12, Stanford, Calif. 1993 which is incorporated herein by reference for all purposes) discusses application of this technique to low power MOS devices. (See also, U.S. patent application Ser. No. 08/357,436). Back-biasing relies on the "body effect" whereby a potential difference between the semiconductor bulk and a device's source shifts that device's threshold voltage. In the case of an NFET, a negative bias on the bulk (with respect to the source) will induce a positive shift in the NFET's threshold voltage. The book "Principles of CMOS VLSI Design" by Weste and Eshraghian, Addison-Wesley Publishing Co. Menlo Park, Calif., pp. 38–39 (1985) describes the physical mechanism underlying the body effect.

In conventional back-biasing, such as the technique envisioned in the Burr et al. article, the potential difference between a device's source and bulk ("Vsb") is controlled to attain a desired threshold voltage. An ohmic contact (known as a "well tie") coupled directly to the bulk/well electrically connects the bulk/well to an external line which is used to apply a potential to the bulk/well. Typically, well ties lie at positions relatively far removed from the channel region where the threshold voltage is controlled. While such well ties allow adequate control in symmetric devices which have relatively large channel regions abutting the bulk, they may be too far removed from the channel to effectively control the threshold voltage of some shorter channel pseudo-devices. This is because other charged regions such as the longer channel pseudo-devices have a strong influence on the potential in the channel region of the shorter channel pseudo-device. Another problem with well ties is that they generally occupy valuable space which could be employed for other purposes—especially in IC designs.

Thus, what is needed is a low threshold voltage asymmetric device that allows convenient adjustment of its threshold voltage.

SUMMARY OF THE INVENTION

The present invention provides a low threshold voltage asymmetric MOS device which includes a contact or conductive tie electrically coupled to a pocket region (described above). This "pocket tie" is also electrically coupled to a conductive line (external to the device) which can be held at a specified potential corresponding to a potential required to back-bias the device by a specified amount. Thus, the present invention allows the potential of the pocket region to be directly controlled in a manner that allows fine adjustment of the device's threshold voltage. As noted, conventional back-biasing techniques require controlling the potential of a device's bulk/well through a well tie far removed from the device's channel region. Therefore conventional back-biasing mechanisms can not adequately control the threshold voltage of an asymmetric device's short channel pseudo-device. In the present invention, however, a back-biasing potential is applied directly to the device's pocket region which is located adjacent to the channel region—and more importantly is located in or adjacent to the short channel pseudo-device. Thus, the present invention provides an effective mechanism for controlling threshold voltage precisely in asymmetric devices.

One aspect of the present invention provides, on a semiconductor substrate, an asymmetric MOS device having an adjustable threshold voltage. The device includes the following elements: (1) a bulk region having a concentration of dopant atoms of a first conductivity type; (2) source and drain regions of a second conductivity type positioned within the bulk region and separated by a channel region; (3) a gate positioned over the channel region; (4) a pocket region having a dopant concentration of the first conductivity type, and abutting one of the source or drain regions and proximate the channel region; and (5) a tie electrically connecting the pocket region to a conductive line, whereby the device's threshold voltage can be adjusted by applying a potential to the conductive line to adjust the pocket region's potential. Preferably, the pocket region extends into a portion of the channel region. It should be noted that while the pocket region generally abuts only one of the source and drain regions (thus the device is termed "asymmetric"), some devices may have a "secondary" halo region abutting the other device element. Such secondary halo regions will not have the same level of dopant concentration and/or size as the "primary" halo region.

Another aspect of the present invention provides a connected group of asymmetric MOS devices having adjustable threshold voltages. The connected group includes the following elements: (1) a plurality of asymmetric MOS devices, each having a structure as described above, and (2) a conductive path of the first conductivity type electrically connecting pocket regions of each asymmetric MOS device in the connected group, whereby the devices' threshold voltages can be simultaneously adjusted by applying a potential to the conductive path to adjust the pocket regions' potentials. Preferably, the conductive path is provided as a region of high dopant concentration along the surface of the semiconductor substrate. Such structure can be conveniently made by forming the conductive pathway by the same implant that is employed to form the pocket regions. Preferably, the conductive region has one pocket tie which is used to control the potential of (and thereby back-bias) all group members' pocket regions simultaneously.

The asymmetric MOS devices of this invention are preferably structured such that they have a ratio of "on current" to "off current" that is at most about $10^5$. The on current is the current that flows between the device's source and drain when the device is "on," i.e., when there is strong inversion in the channel region (Vds=Vdd=Vgs). The off current is the current flowing between the device's source and drain when the device is off (Vds=Vdd; Vgs=0). The off current is synonymous with "leakage current." Generally, devices with such low ratios of on current to off current have low threshold voltages (e.g., between about ±150 mV).

In 0.35 µm technology (i.e., the gate poly length is about 0.35 µm and the gate oxide is about 65 Å thick), the asymmetric halo region preferably has a dopant concentration of at least about $1 \times 10^{16}$ cm$^{-3}$ (and more preferably between about $1 \times 10^{17}$ and $1 \times 10^{18}$ cm$^{-3}$). In some preferred embodiments, the asymmetric halo region is located under the source or drain region and does not extend into or under the channel region. In other embodiments, however, the asymmetric halo region may partially extend into or under the channel region adjacent the source region. To maintain a low gate threshold voltage, the channel region dopant concentration should be held to at most about $1 \times 10^{16}$ cm$^{-3}$ and preferably between about $1 \times 10^{14}$ and $1 \times 10^{16}$ cm$^{-3}$. In one preferred embodiment, the asymmetric MOS device also includes a counterdopant of the second conductivity type located in at least a portion of the channel region. Preferably the counterdopant is provided in a concentration of between about $10^{16}$ and $10^{18}$ cm$^{-3}$ and is located such that a depletion region associated with a counterdopant-bulk junction does not extend across the channel region to the gate.

Another aspect of this invention provides a method of forming an asymmetric MOS transistor on a semiconductor substrate. This method includes the following steps: (1) providing a bulk region having a first conductivity type; (2) forming a gate over a portion of the bulk region which defines a channel region; (3) forming a pocket region of the first conductivity type on a first side of the channel region; (4) forming source and drain regions of a second conductivity type separated by the channel region; and (5) forming a conductive tie to the pocket region. The pocket region should be formed such that it abuts at least a portion of one of the source or drain regions and is proximate to the channel region. After the conductive tie is formed, it must be connected to a conductive line formed on a metallization layer above the semiconductor substrate.

In a preferred embodiment, the step of forming a conductive tie to the pocket region includes the following steps: (1) forming an insulating layer over the semiconductor substrate; (2) forming a via in the insulating layer above a portion of the pocket region; and (3) filling the via with a conductive material. In further preferred embodiments, the step of filling the via with a conductive material includes the following steps: (1) conformally depositing a layer of material to serve as a diffusion barrier over the insulating layer; and (2) depositing a layer of the conductive material over the layer of material to serve as the diffusion barrier.

These and other features and advantages of the present invention will become apparent to those skilled in the art upon reading the following description and studying the associated figures.

DETAILED DESCRIPTION OF THE INVENTION

The Structure of Low Vt Asymmetric Devices

In the following description of preferred embodiments, various dopant concentrations are specified. It should be understood that these concentrations are most appropriate for MOS devices having drawn channel region lengths of about 0.35 µm (corresponding to effective channel lengths of about 0.25 µm) and gate oxide thicknesses of about 65 Å. It should also be understood that dopant concentrations in devices generally vary inversely with device size; as device size decreases, the dopant concentration increases. This is because (1) depletion regions adjacent source and drain regions must scale with channel region width to prevent punch through, and (2) to shrink the depletion regions, dopant concentrations must increase. As this invention is not limited to 0.35 µm technology, the concentrations set forth below are exemplary only. It should be expected that the preferred concentrations will increase as necessary to reduce depletion region sizes in smaller devices (less than about 0.35 µm devices). Likewise, preferred concentrations may decrease in longer channel devices.

Throughout this specification, the term "channel region" will be used frequently. That term, as used herein, refers to the entire electrically active region between the source and drain, not just the inversion layer formed when the gate voltage exceeds Vt.

Figure 1A:
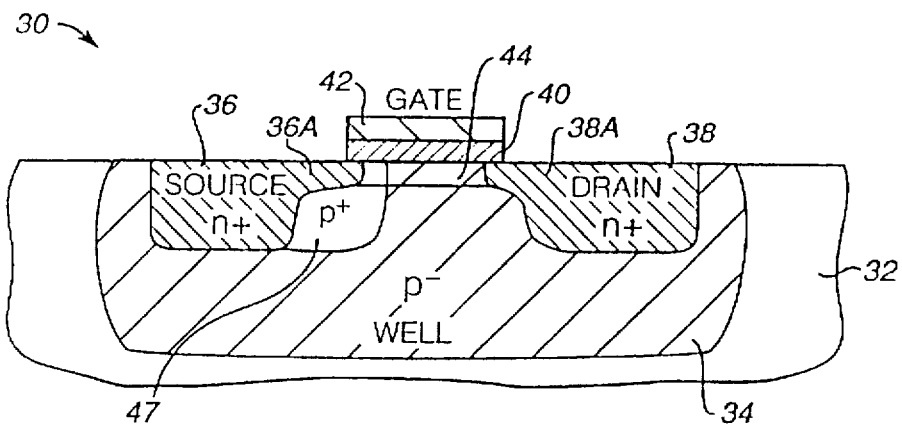
FIG. 1a is a side sectional view of a preferred asymmetric MOS transistor having a pocket region in accordance with the present invention.

Turning now to FIG. 1a, a side sectional view of an asymmetric MOS device 30 is shown. As discussed in more detail below, such device can profit from the back-biasing mechanism provided by the present invention. Device 30 includes a lightly doped p-type well region 34 extending downward from the surface of a semiconductor substrate 32 into its bulk. Preferably, this well region—excluding the source, drain, and pocket regions—has an average dopant concentration of between about $1 \times 10^{14}$ and $5 \times 10^{16}$ cm$^{-3}$.

Provided within well region 34 are (1) a heavily doped n-type source region 36 with an associated "tip" 36A, and (2) a corresponding heavily doped drain region 38 with an associated tip 38A. Preferably, the dopant concentrations of the source region 36 and drain region 38 each vary between about 1 and $2 \times 10^{20}$ cm$^{-3}$, and the dopant concentrations of the tips vary between about 4 and $8 \times 10^{19}$ cm$^{-3}$. In some embodiments, the source and drain (or one of the two) will be shaped such that they do not have tips; rather they will include only plug portions which extend up to the channel region. As such devices have lower source or drain resistances (in comparison to their tipped counterparts), they are preferred in some embodiments.

It should be noted that the specific transistor 30 shown in FIG. 1a is an NFET, i.e., it has an n-type source, an n-type drain, and a p-type well. Although not shown, transistor 30 could also be a PFET transistor having a p-type source, a p-type drain, and an n-type well. In that case, the dopant concentrations specified herein for NFETs would apply with equal validity to the PFET—only the dopant conductivity types would be reversed. It should also be noted that in some embodiments, the bulk semiconductor 32 may be provided with a sufficiently high p-type dopant concentration that no well region is required. In such cases, the source and drain regions can be formed directly in the bulk. Of course, if both p-type and n-type devices are formed on the same semiconductor substrate 32, the p-type devices will have to be formed in lightly doped n-type wells—assuming that the substrate is lightly doped with p-type dopants.

A channel region 44 is provided in the device 30 between the source and drain tip regions 36A and 38A. As noted, the dopant concentrations presented herein are most appropriate for devices having drawn channel lengths of about 0.35 µm. However, it should be borne in mind that many advantages of the asymmetric structure of this invention also apply to longer channel devices. In general, the devices of the present invention preferably have drawn channel lengths of about 2 µm or less, and are more preferably in the range of about 0.5 µm or less. Thus, the inner boundaries of the device's source and drain tips should be no more than about 2 µm apart.

The dopant concentration in channel region 44 directly affects the threshold voltage of the MOS device. As noted, this invention is directed to devices having unconventionally low threshold voltages, so control of the channel region dopant concentration is quite important. Generally, as the p-type dopant concentration decreases in the channel region, the threshold voltage also decreases. Thus, it is generally desirable in the context of this invention to provide a rather low p-type dopant concentration in channel region 44. Preferably, channel region 44 has a p-type dopant concentration of less than about $1 \times 10^{16}$ cm$^{-3}$ (more preferably between about $1 \times 10^{14}$ and $1 \times 10^{16}$ cm$^{-3}$, and most preferably about $1 \times 10^{15}$ cm$^{-3}$). Such low channel region doping concentrations allow the device threshold voltage to be set at or near zero volts (either positive or negative). In especially preferred embodiments, the channel region is counterdoped with an n-type dopant to achieve even lower threshold voltages. Preferably, the counterdopant concentrations are in the range of about $10^{16}$ to $10^{18}$ cm$^{-3}$. Special considerations associated with counterdoping will be discussed below.

It is worth noting that while the back-biasing mechanism of this invention provides some control over the threshold voltage, this control should be viewed as fine control—involving threshold adjustments of a few hundred millivolts only. Much greater adjustments in threshold can be accomplished by controlling channel dopant concentrations. Thus, it is important to provide the asymmetric devices of this invention with channel dopant concentrations appropriate for the range of threshold voltage under which the device is expected to operate.

Returning to FIG. 1a, a gate dielectric layer 40 is provided on the surface of the p-type well 34 and overlying the channel region 44. In preferred embodiments (for 0.35 μm devices), gate dielectric layer 40 is preferably silicon dioxide at about 65 Å thick. An n-type gate layer 42 is provided on the oxide layer 40 as shown. In general for the low threshold voltage devices of this invention, gate layer 42 will be n-type in NFETs and p-type in PFETs. In contrast, high threshold voltage, long channel PFETs typically have n-type gate layers.

An asymmetric "halo" or pocket region 47 is provided in well 34 underlying the source tip region 36A. It should be noted that the pocket region may be provided under either the source or drain tip region. However, throughout the remainder of this discussion, the asymmetric halo device will be described as having a pocket region under the source region. In preferred embodiments and as shown in FIG. 1a, pocket region 47 extends into and under a portion of the channel region 44. However, in alternative embodiments discussed below, this need not be the case. In fact, the pocket region need not even reside "under" the channel region. Regardless of its actual location and shape, the pocket region 47 has a "p+" concentration, i.e. it has a somewhat higher dopant concentration than the surrounding p– region of well 34. Preferably, the dopant concentration of pocket region 47 is between 10 and 1000 times greater than the dopant concentration in the well. Thus, the pocket region 47 should have a net dopant concentration of at least about $1 \times 10^{16}$ cm$^{-3}$, and more preferably between about $1 \times 10^{17}$ and $1 \times 10^{18}$ cm$^{-3}$. In all embodiments of this invention, no corresponding pocket regions are provided under the drain tip 38A, hence the devices are termed "asymmetric." Of course, the present invention does not foreclose the possibility that some local increases in p-type dopant concentration will be found around the drain region. However, to ensure that the device has the benefits of being asymmetric, any such local variations should be limited in size and/or dopant concentration.

In the embodiment shown in FIG. 1a, the pocket region 47 extends only very slightly into the channel region 44. This is in keeping with the design objective that the short channel pseudo-device (a source FET in the case of FIG. 1a) has an extremely short effective channel length. Preferably, the pocket region 47 extends no more than 0.1 μm into the channel region 44, and more preferably no more than about 500 Å into the channel region.

Figure 1B:
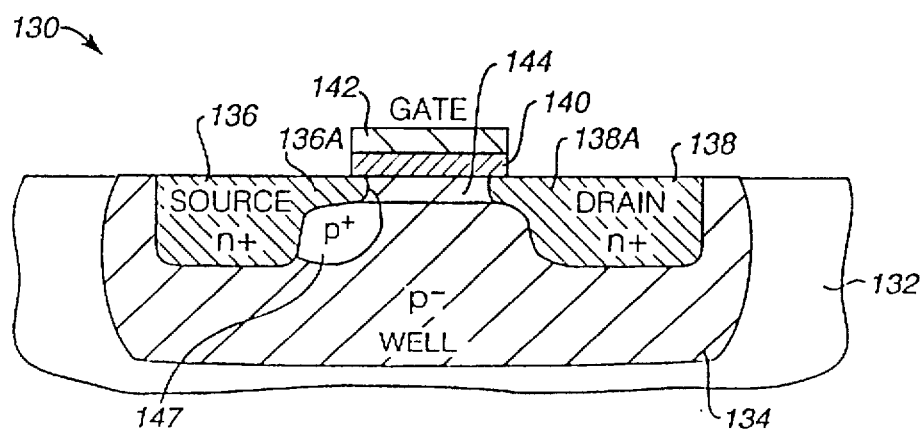
FIG. 1b is a side sectional view of a first alternative asymmetric MOS transistor having a pocket region in accordance with the present invention.
Figure 1C:
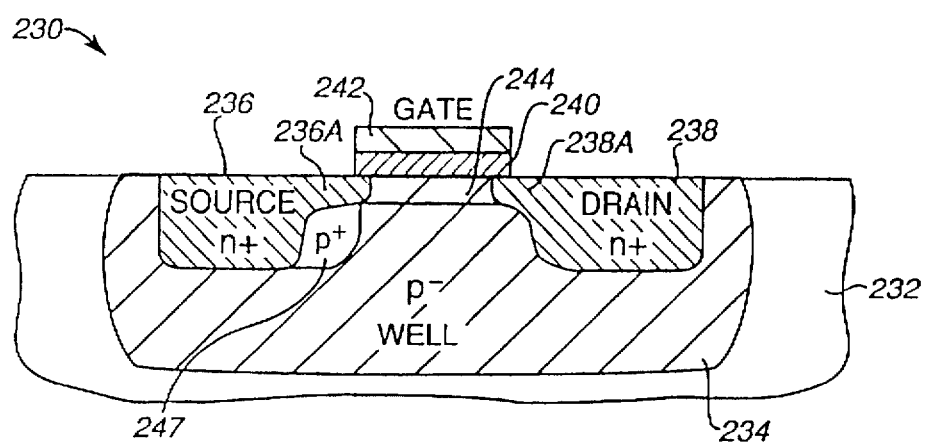
FIG. 1c is a side sectional view of a second alternative asymmetric MOS transistor having a pocket region in accordance with the present invention.

FIGS. 1b and 1c display alternative embodiments of the present invention in which the pocket region underlying the source tip takes on different shapes/locations within the asymmetric MOS device. In FIG. 1b, an asymmetric CMOS device 130 includes a pocket region 147 which extends slightly under (but not into) channel region 144 (compare pocket region 47 of FIG. 1a). Otherwise, this embodiment is quite similar to that depicted in FIG. 1a. Specifically, the device includes a source 136, a drain 138, a well 134, a gate 142, and a gate dielectric 140. As device 130 is also an asymmetric device, there is no pocket region under drain 138. Conveniently, the pocket region 147 can be formed by, for example, an implant made at an angle having a horizontal component (left to right as shown in FIG. 1b). In FIG. 1c, an asymmetric MOS device 230 includes a pocket region 247 that does not extend beyond the edge of source region 236A or into channel region 244. The device features are otherwise the same as those of the embodiments in FIGS. 1a and 1b. Thus, the device includes a source 236, a drain 238, a well 234, a gate 242, and a gate dielectric 240. Other structural alternatives to the asymmetric device shown in FIG. 1a are described in U.S. patent application Ser. No. 08/357,436 which was previously incorporated herein by reference.

In the embodiments illustrated in FIGS. 1a–1c, contacts or ties (not shown) are provided for the source, drain, and gate regions respectively. Such contacts connect these elements to conductive lines patterned on one or more metallization layers disposed above the MOS devices 30, 130, and 230. In addition, each of these devices has a separate tie (also not shown) electrically connected to its pocket region. These various ties are electrically isolated from one another and from the device's gate by an oxide, glass, or other insulating layer (sometimes referred to as a passivation layer). The ties are typically formed of tungsten, aluminum, aluminum/copper alloy, etc. They may be separated from the underlying semiconductor substrate (or gate polysilicon) by a layer of titanium and a layer of titanium nitride to prevent metal species from migrating into the semiconducture and thereby degrading performance.

Figure 2:
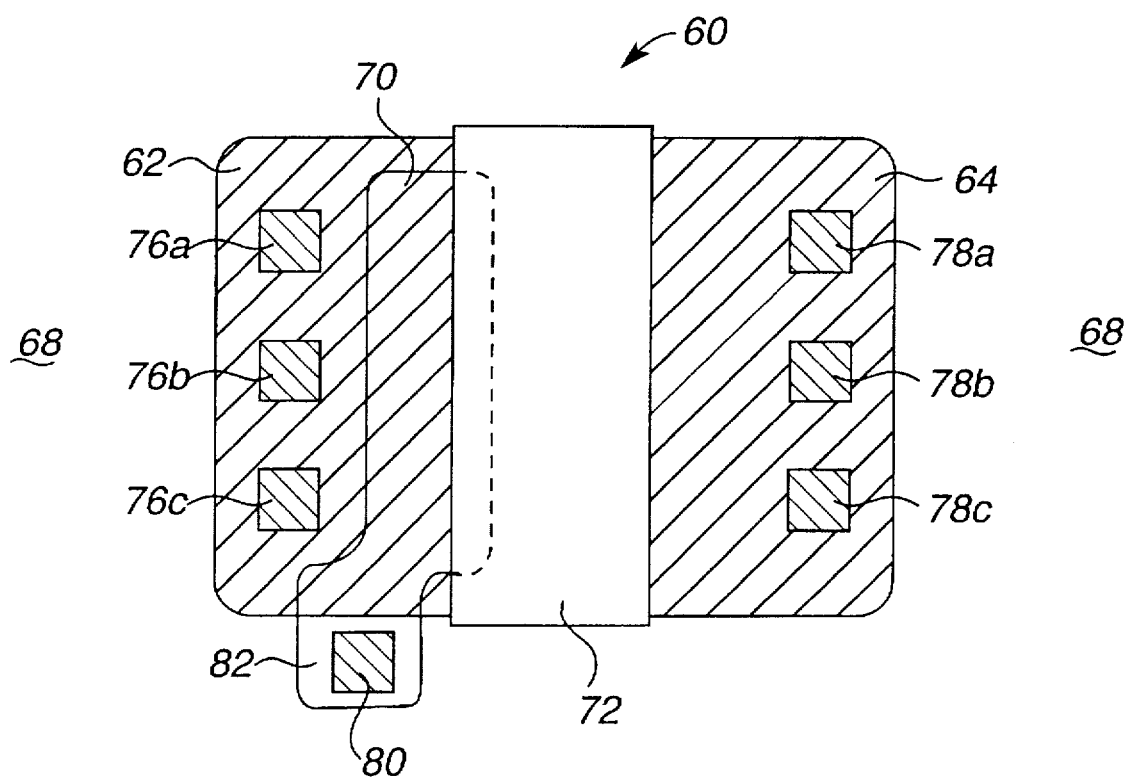
FIG. 2 is top down view showing the location of a pocket tie/contact on an asymmetric AOS transistor of this invention.

FIG. 2 is top down view of an asymmetric MOS device 60 illustrating the use of a pocket tie in accordance with this invention. This view assumes that all "back-end" features including metallization layers, interconnects between metallization layers, and dielectric layers (including field oxide and passivation layers) have been removed, and that all that remains is the semiconductor substrate and the functional remnants of a polysilicon layer. Thus, viewing the top surface of the semiconductor substrate, a source region 62 and a drain region 64 can be seen within a well or bulk region 68. In addition, a pocket region 70 is shown abutting source region 62 and extending into a channel region (as indicated by the broken line). Moving to the polysilicon layer, a polysilicon gate 72 is shown covering the channel region between source region 62 and drain region 64. Further, three metal source ties 76a, 76b, and 76c provide ohmic contact to source region 62 and three metal drain ties 78a, 78b, and 78c provide ohmic contact to drain region 64. Finally, a metal pocket tie 80 provides ohmic contact to pocket region 70.

The ties shown in FIG. 2 are necessary to electrically connect elements of the asymmetric device 60 with conductive lines (not shown) in one or more patterned metallization layers—such as a metal 1 or metal 2 layer—formed by a conventional fabrication technique. Specifically, the ties extend vertically from their respective device elements above the plane of the semiconductor substrate surface to contact specified conductive lines. The pocket tie 80 is particularly important to this invention as it provides a conductive path between the pocket region 70 and an external line which controls the potential within pocket 70, thereby controlling the threshold voltage of the device.

Pocket tie 80 resides just outside of the asymmetric MOS device 60. This location is dictated by the pocket's position within the device. As shown in FIG. 1a, a portion of the pocket region lies under the source tip. Thus, this portion of the pocket region lies below the surface of the semiconductor substrate, and is not available to make contact with a poly layer. Further, as shown in FIG. 1a, most of the remaining portion of the pocket region extends into the channel region where it contacts the substrate's surface under an insulating layer of gate dielectric. Thus, this portion of the pocket also is unavailable for contact to the poly layer. Therefore an additional region or extention of the pocket is required to make contact with conductive lines external to the device itself. In a preferred embodiment, this need is addressed by providing the pocket region with a lateral extention 82 (FIG. 2) for making contact with overlying conductive lines. This region, which extends beyond the edge of the source region 62 and away from gate 72, reaches the semiconductor surface. Thus, the pocket tie 80 can be conveniently formed on pocket extention 82 as shown.

As noted, back-biasing is conventionally performed by controlling the well or bulk potential independently of the source potential. One problem associated with this approach is that the well or bulk may have a relatively low dopant concentration, which means that the conductivity is also low. Thus, accurate control of the channel region's potential is difficult because of capacitive coupling of switching drains, particularly at high frequencies. The approach taken by the present invention avoids this difficulty by controlling the potential of a relatively conductive device element (the pocket region) which is located in or adjacent to the channel.

In a further preferred embodiment of the invention, a conductive pathway connects the pocket regions of a group of asymmetric MOS devices. By controlling the potential of such conductive pathway, the pocket region potential of each device in the group can be simultaneously adjusted, to effect simultaneous back-biasing. Preferably, the conductive pathway is formed within the semiconductor substrate (and possibly along its surface), and is formed by the same implant that forms the device pocket regions.

Figure 3:
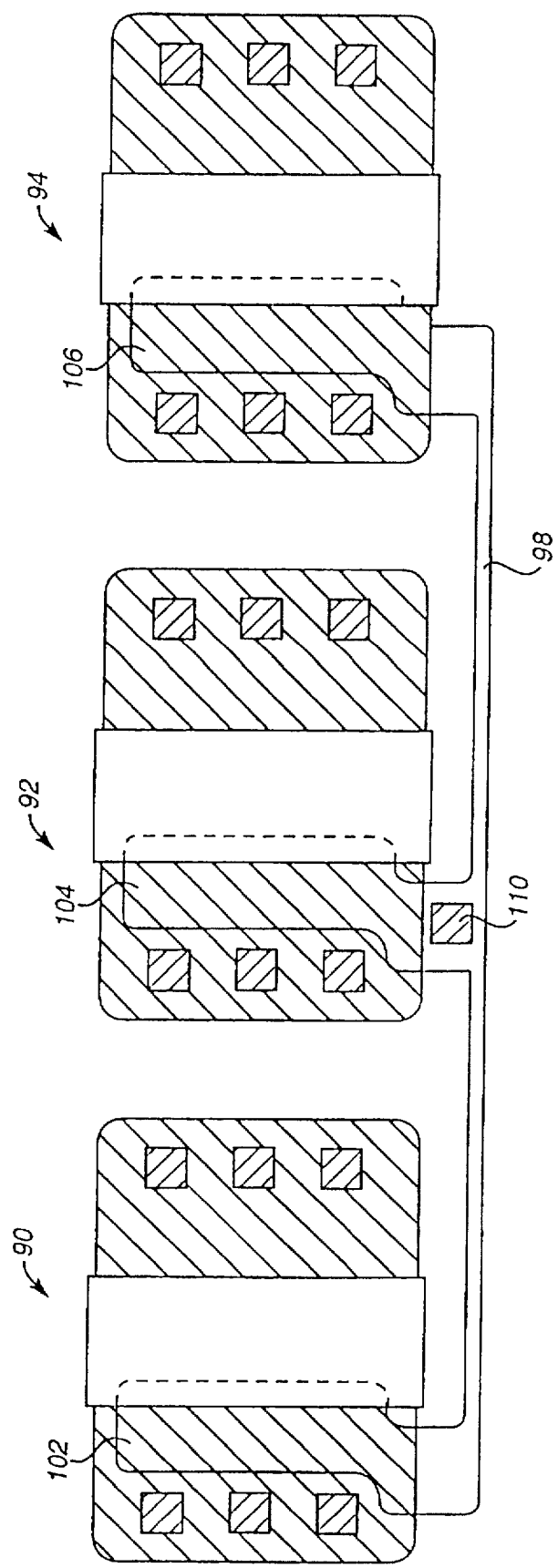
FIG. 3 is a top down view of a group of asymmetric MOS devices having their pocket region connected by a conductive pathway in accordance with one embodiment of this invention.

FIG. 3 illustrates one implementation of such conductive pathway. Like FIG. 2, FIG. 3 is a top down view showing the semiconductor substrate surface and the requisite polysilicon structures formed thereon. A connected group of asymmetric MOS devices 100 is shown to include three individual devices 90, 92, and 94 connected by a conductive pathway 98. As shown, conductive pathway 98 connects pocket regions 102, 104, and 106 of devices 90, 92, and 94 respectively. In addition to pocket regions 102, 104, and 106, asymmetric devices 90, 92, and 94 include the other necessary MOS device elements including gates, sources, drains, and source/drain ties as shown. As these elements were described with reference to FIG. 2, they will not be redescribed here.

In order for the devices to be connected in the manner of this invention, they should generally be of the same conductivity type (assumed to be NFETs for the sake of this description). Thus, conductive path 98 and all pocket regions 102, 104, and 106 form a continuous p-type implant region. The potential of this entire region is controlled by a single tie 110 located on conductive path 98 near device 92. While pocket tie 110 is preferably centrally located in the collection of connected devices, it could, in principle, be located anywhere on conductive path 98 or on any of the extensions from pocket regions 102, 104, and 106. As the conductive path is an extention of the pocket regions, it should have nearly the same dopant concentration as the pocket regions themselves, i.e., at least about $1 \times 10^{16}$ cm$^{-3}$, and more preferably between about $1 \times 10^{17}$ and $1 \times 10^{18}$ cm$^{-3}$. The region immediately below pocket tie 110 may have a higher concentration in order to ensure a good ohmic contact.

One advantage of connecting a group of MOS devices in the manner shown in FIG. 3 is that the connection between the various devices required for back-biasing can be placed within the semiconductor substrate rather than being located in the overlying polysilicon or metal layers. Thus, the present invention represents an advance in that ties dedicated to back-biasing occupy less chip area. This is possible because (1) the pocket regions and conductive pathway have a higher concentration of dopant and therefore a higher conductivity than well regions, and (2) the pockets are located immediately adjacent to the channel region.

Which MOS devices are connected via a conductive pathway will be governed by various criteria, such as the devices' proximity to one another, their conductivity type, their activity (memory versus processing), and whether they are on a critical path. Although three connected devices are shown in FIG. 3, more devices may be connected on the same path. Alternatively, it may sometimes be desirable for each device to have its own pocket tie when, for example, each device must be back-biased independently. In such cases, the conductive pathway in the substrate will generally be unnecessary.

Regardless of whether a given pocket tie contacts one or many devices, back-biasing in accordance with this invention is accomplished by controlling the potential difference between the source and pocket regions of each device. The potential is controlled through the isolated ohmic ties/contacts to the source and the pocket regions together with the circuitry necessary for independently controlling the potential of these two regions. As the potential difference is increased, the magnitude of the threshold voltage increases. In general, a relatively large back-bias voltage is required to adjust the threshold voltage a comparatively small amount. In preferred embodiments, the device will be engineered such that a shift in threshold voltage of between about 50 and 200 millivolts (more preferably about 100 millivolts) is accomplished with about 1 volt of back-bias. This sensitivity is generally higher when the device is designed such that (1) there is a very low net dopant concentration in the depletion region of the device's channel region, and (2) there is a significantly higher net dopant concentration just below the depletion region within the device's pocket region. Thus, it may be desirable to design a "retrograde" pocket region which has a higher dopant concentration below the channel region. Of course, if the device is counterdoped, the net dopant concentration at the intersection of the channel region with the pocket region will automatically be lowered, thereby increasing the device's back-biasing sensitivity.

Back-biasing can be implemented using various automatic techniques. In one such method, a feedback amplifier adjusts the bias voltage of a device's pocket so that the drain current of a test device in the pocket matches a reference current. A tuning circuit can be designed to match the off current (in the range of 1 nanoamp to 1 microamp), or the on current (in the range of 100 microamp/micrometer to 1 microamp/micrometer), or some function of both the on and off currents. Such circuits can sample the current from several test devices to obtain average on and off currents. The power dissipation of one of these pocket-tuning circuits is typically quite small, on the order of 1 microwatt, and its area is also small, typically about 100 square micrometers. Thus, hundreds or even thousands of such circuits can be distributed throughout an integrated circuit chip without significantly impacting area or power, while substantially improving low voltage performance by providing tightly controlled operating environments over small, local transistor populations.

As noted, back-biasing is necessitated by the low threshold voltages required for the asymmetric MOS devices of this invention. "Low" threshold voltages in the context of this invention may be defined in various ways. One definition states that a low threshold device has a ratio of on current to off current of at most about $10^5$. This definition relies on the fact that low threshold devices have relatively large leakage currents, a feature traditionally considered undesirable in IC designs. Thus, most conventional devices are designed to have a ratio of "on current" to "off current" (a measure of leakage current) of at least about $10^6$ and typically in the range of $10^7$ to $10^8$. Such high ratios may be appropriate for relatively inactive circuits such as DRAM cells. However, in more active circuits typically used in microprocessors, the leakage current is of less concern, and the threshold voltage can be substantially lowered. The present invention is primarily concerned with such active circuits (and low threshold voltage devices). Therefore, the devices of the present invention will preferably be characterized by a ratio of on current to off current of at most about $10^5$, and more typically about $10^2$–$10^3$. For some highly active devices, it may even be desirable to have a ratio of on current to off current of as low as 10. In terms of absolute threshold voltage, the MOS devices of this invention will preferably have a Vt of between about −150 and +150 millivolts. However, this range is not critical to the practice of the invention.

It should be noted that when devices are in standby mode (i.e., their activity decreases), it may be desirable to increase their threshold voltage and thereby reduce leakage current. This may be accomplished with the back-biasing mechanisms of this invention. Specifically, in the context of this invention, a device which normally has a ratio of on current to off current of $10^5$ may have its ratio increased to, for example, $10^7$ by back-biasing when it goes to standby mode.

As noted above, low threshold voltage asymmetric MOS devices are believed to operate as two pseudo-devices in series—a source FET and a drain FET—with the shorter channel device being adjacent to the pocket region and therefore having a higher threshold voltage. U.S. patent application Ser. No. 08/357,436 presents in some detail the theory of operation of such devices. Briefly, the size, location, and dopant profile of the pocket region are chosen such that the region of increased threshold voltage is a very short segment of the channel region (preferably on the order of a few hundred angstroms to 0.1 micrometers). When the device does switch on, at gate voltages above the threshold voltage associated with the short channel device, a significant fraction of the charge carriers cross the short channel by ballistic transport.

As pointed out in U.S. patent application Ser. No. 08/357,436, various factors come into play in controlling the short channel pseudo-FET channel length. These include (1) the dopant distribution in the tip of the source or drain (whichever abuts the pocket), (2) the dopant concentration gradient at the side of the pocket abutting the channel region, (3) the dopant concentration gradient of the source/drain body adjacent the pocket, and (4) the distance that the pocket extends into or underneath the channel region. By controlling these variables, it is believed that the short channel pseudo-FET channel can be made smaller than 0.1 micrometers and preferably in the range of 200 to 500 angstroms. In general, good results should be expected by providing a very steep dopant concentration gradient at the boundary of the pocket and the bulk (well) regions. Preferably the dopant concentration will drop by as much as 3 orders of magnitude over about 3 nanometers between the pocket region and the bulk region. (Such steep gradients have been described in a paper by Sai-Halasz et al., "High Transconductance and Velocity Overshoot in NMOS Devices at the 0.1-μm Gate-Length Level," IEEE Electron Device Letters, Vol. 9, No. 9, pp. 463–465 (1988) which is incorporated herein by reference for all purposes.) Similarly, the dopant concentration gradients at the source/drain tip-channel region boundary and at the source/drain body-pocket boundary should be comparably steep. Still further, a thin tip region (with a pocket region lying immediately underneath) will generally improve performance by reducing punch through effects. Of course, if the tip region becomes too thin, the source resistance will be too high.

High performance operation of asymmetric devices requires that the longer channel pseudo-FET have a very low threshold voltage. To engineer the MOS devices of this invention so that their threshold voltages are as low as possible in the longer channel pseudo-device, it is desirable to maintain a low dopant concentration in the channel region. Generally, decreasing the concentration of dopants (of the same conductivity type as the well/bulk) lowers the device's threshold voltage. In the case of an NFET, the net concentration of p-type dopants should be maintained at low level in the channel region. For example, a p-type dopant total concentration of $10^{15}$ cm$^{-3}$ in the channel region results, under the right conditions, in a −0.3 V threshold. Even lower threshold voltages can be obtained by counter doping the channel region with n-type dopants to effectively lower the "net" concentration of p-type dopant atoms. For example, if the total concentration of p-type dopant atoms is $10^{15}$ cm$^{-3}$ in the channel region, counterdoping with n-type dopant atoms to the level of $6\times10^{14}$ cm$^{-3}$ reduces the net concentration of p-type dopant atoms to $4\times10^{14}$ cm$^{-3}$, thereby lowering the threshold voltage. In some embodiments of this invention, the counterdopant concentration exceeds the normal dopant concentration thereby reversing the conductivity type of the channel region. For certain devices, counterdopant concentrations in the range of about $10^{16}$ to $10^{18}$ cm$^{-3}$ (exceeding the normal dopant concentrations) result in a threshold voltage of about −0.5 to −1 volts.

It should be understood that such low thresholds will be attained only in the longer channel pseudo-device—especially when the pocket region extends up into the channel region to define a source FET (or drain FET in other embodiments). This is because there will be a nonuniform distribution of p-type dopants in the channel region, with a much greater concentration in the vicinity of the source. It should be understood that counterdoping such structures may result in the drain side of the channel (corresponding to the longer channel pseudo-device) being n-type while a narrow sliver on the source side of the channel (corresponding to the shorter channel pseudo-device) being p-type. In a preferred embodiment, the n-type counterdopant concentration is between about $10^{16}$ and $10^{18}$ cm$^{-3}$ throughout the entire channel region, and the p-type dopant concentration is between about $10^{17}$ and $10^{18}$ cm$^{-3}$ at the pocket region and between about $10^{14}$ and $10^{16}$ cm$^{-3}$ throughout the rest of the channel region. Thus, the net dopant concentration may be between zero and up to possibly about $10^{18}$ cm$^{-3}$ p-type in the vicinity of the channel region—pocket region intersection, and up to about $10^{18}$ cm$^{-3}$ n-type throughout the rest of the channel region.

It should be understood that by reversing the channel conductivity type through counterdoping, one introduces an n-p junction between the channel and the well/bulk. Therefore the device must be engineered to account for the associated depletion region. In general, the counterdopant profile should be structured such that the depletion region emanating from the counterdopant-substrate interface does not extend vertically through the n-type layer to the substrate-oxide interface; otherwise the longer channel pseudo-FET acts as a resistor and a substantial potential drop occurs across it. To avoid this problem, the counterdopant region should be thick enough, with a high enough concentration, to avoid becoming fully depleted.

To prevent punch-through in the shorter channel pseudo-FET, the counterdoped region of the channel should not be too deep. In addition, its concentration should be lower than that of the pocket region so that the net dopant concentration in the pocket region results in the desired threshold voltage for the short channel pseudo-FET, e.g. close to 0 volts. A properly engineered counterdopant region, in addition to reducing the threshold of the longer channel pseudo-FET, causes that pseudo-device to become a buried channel device, improving mobility, reducing vertical field, and reducing gate capacitance. However, on the down side, the counterdopant degrades subthreshold slope and causes the device to suffer from increased drain induced barrier lowering.

The Process of Fabricating Low Vt Asymmetric Devices

FIGS. 4A–J illustrate some of the important steps in the fabrication of an MOS device (an NFET in this example) in accordance with the present invention. It should be understood that numerous variations of this process are permissible and within the scope of this invention. Further, although this process is described as a sequence of steps for forming an NFET, the process could be applied equally to a PFET if the conductivity types of the dopants employed in the various steps are reversed. Still further, it should be understood that the conditions recited herein are appropriate for devices in the neighborhood of 0.35 μm. The process conditions may have to be modified somewhat for devices in other size regimes, according to design criteria known in the art.

Figure 4A:
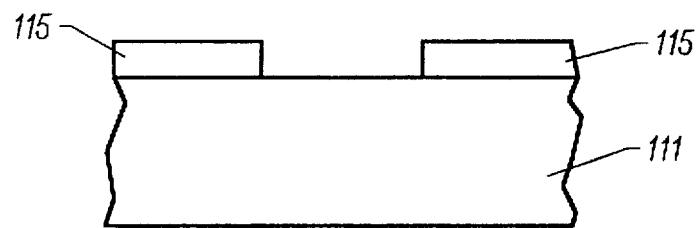
FIGS. 4A-4J are side sectional views of a partially completed asymmetric MOS device in accordance with a fabrication method of this invention.

In FIG. 4A, a substrate 111 of silicon or other suitable semiconductor material is provided with an ion implant mask 115 of photoresist or other suitable masking material which exposes a selected portion (the "p-well portion") of substrate 111.

Figure 4B:
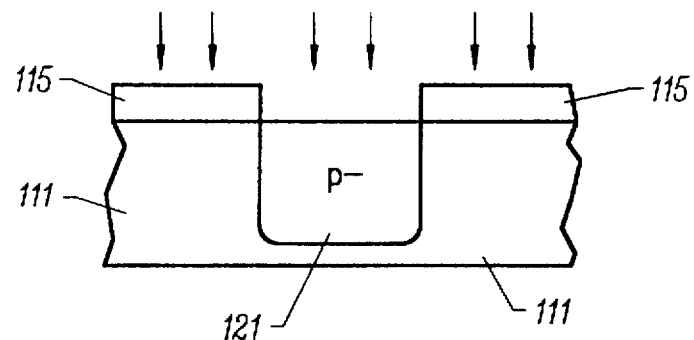

In FIG. 4B, a p-type ion implant is performed over the substrate, penetrating the unmasked portion of the substrate 111 (the "p-well portion"). The p-type dopant is provided at a dose and energy sufficient to provide a very lightly doped well region 121. A subsequent diffusion anneal is then conducted at a temperature and for a time sufficient to smooth out the p-type dopant concentration over well region 121 to give a relatively uniform overall very light p- doping level. The well formation conditions should be chosen such that the p-well region has a dopant concentration at the substrate surface (i.e., the channel region) of between about $1 \times 10^{14}$ and $1 \times 10^{16}$ cm$^{-3}$ (as discussed above). It should be noted that, in many systems, there is no explicit well. Rather, the silicon wafers used to make the devices are cut from single crystal silicon grown with a specific dopant concentration. In an alternative embodiment, a layer of silicon of the desired bulk concentration is grown epitaxially on top of a heavily doped substrate.

Figure 4C:
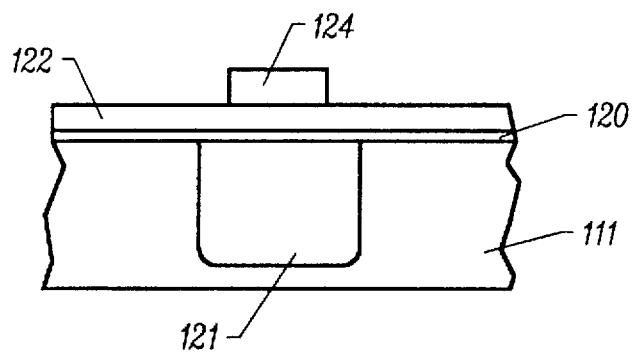

To obtain the structure shown in FIG. 4C, the mask 115 is removed and a pad oxide 120 (silicon dioxide) covering the substrate 111 is grown to a thickness of between about 30 and 80 nanometers at a temperature in the range of about 700° to 1000° C. Next, a layer of silicon nitride 122 is deposited, typically by low pressure vapor chemical deposition (LPCVD), to a thickness of between about 0.1 and 0.2 micrometers on pad oxide 120. Thereafter, a resist mask 124 is provided to protect the active areas (i.e., regions where active MOS devices are to be formed).

Figure 4D:
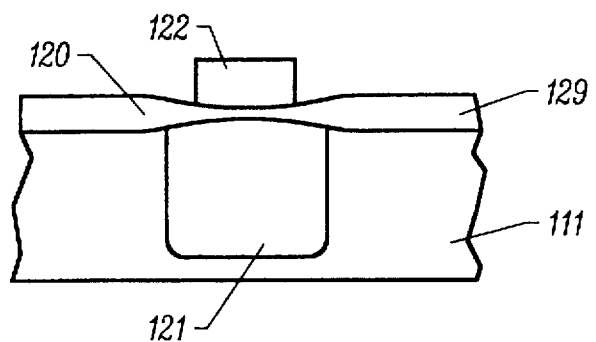
Figure 4E:
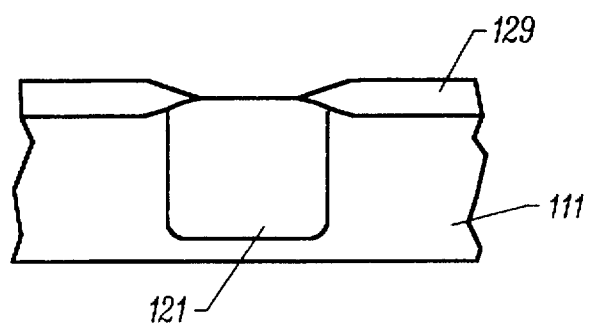
Figure 4F:
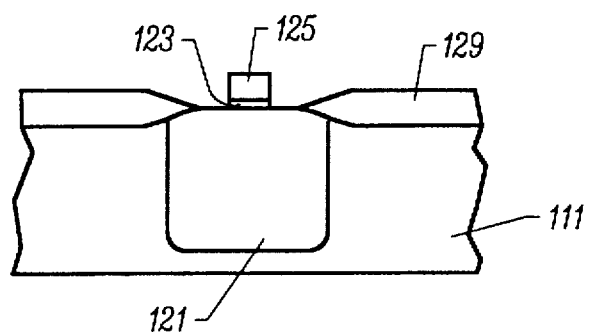

The structure shown in FIG. 4D is then prepared as follows. A dry etch (typically a reactive ion etch or RIE) is performed on the exposed nitride and oxide layers to produce a bare silicon surface in these regions. Next, the resist mask is removed and a thick field oxide 129 (silicon dioxide) is grown at a temperature of between about 700° and 1000° C. to a thickness of between about 0.2 and 0.5 micrometers to produce the structure shown in FIG. 4D. Thereafter, this structure is selectively etched to remove nitride layer 122, typically by a wet etch with ortho-phosphoric acid. A further timed wet etch is then performed to remove the pad oxide 120 and expose the silicon substrate in the active device regions. This produces a structure as shown in FIG. 4E. The field oxide 129 functions to electrically isolate the various devices on a chip. In alternative embodiments, trenches could be used in place of the field oxide to isolate devices on the chip. Processes for forming trench isolation regions are known in the art.

After the bare silicon substrate has been exposed, a counterdopant implant produces a counterdopant concentration of about $10^{16}$ to $10^{18}$ cm$^{-3}$ in the region immediately under the substrate surface (an area which will include the channel region in the completed device). Thus, the region immediately underlying the substrate surface has an n-type conductivity.

Next, a thin gate oxide 123 is grown on the bare silicon surface at a temperature of between about 800° and 950° C. to a thickness of between about 3 and 15 nanometers. Typically, the gate oxide will be a single layer of silicon dioxide, but it may also be a multi-layer structure including silicon nitride. (Technically, such multi-layer structures should be referred to as "gate dielectrics" rather than merely "gate oxides.") After the gate oxide or gate dielectric has been formed, a gate layer of polysilicon is deposited over the surface to a thickness of between about 100 and 300 nanometers. On this layer, a resist mask is defined to protect the transistor gate region. Then, the exposed polysilicon is selectively etched and the resist mask is removed to provide the structure shown FIG. 4F.

Figure 4G:
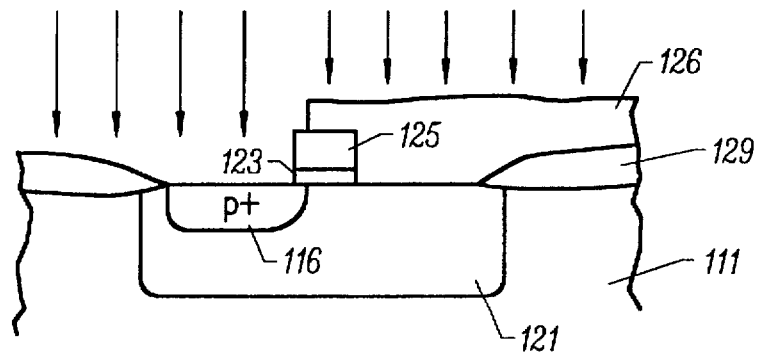

Next, as shown in FIG. 4G, a mask 126 is formed over one side of the active region. Thereafter a p-type dopant implant is conducted at an energy and dosage sufficient to form an asymmetric pocket region 116. For example, this asymmetric halo implant might be conducted with boron implanted at about $5\times10^{12}$ to $5\times10^{13}$ cm$^{-2}$ at an energy of between about 50 and 70 keV. It should be noted that the mask 126 is designed so that implanted pocket will have an extention such as region 82 of FIG. 2 or conductive pathway 98 of FIG. 3. That is, a top down view of mask 126 should appear in the shape of pocket region 70 (plus extention 82) of FIG. 2. Alternatively, mask 126 should appear in the shape defined by pocket regions 102, 104, and 106 in conjunction with conductive pathway 98 of FIG. 3.

In some embodiments, indium may be an appropriate dopant for NFETs and antimony may be an appropriate dopant for PFETs because these elements have relatively small diffusion coefficients and therefore are likely to form pockets having steeper concentration profiles. However, if the pocket region is to extend into the channel region, as shown in FIG. 1a, it may be desirable to employ more mobile dopant species such as boron or phosphorous. Such species can relatively easily diffuse into the channel region. Alternatively, the pocket implant may be conducted at an angle which drives the dopant laterally into the edge of the channel.

Figure 4H:
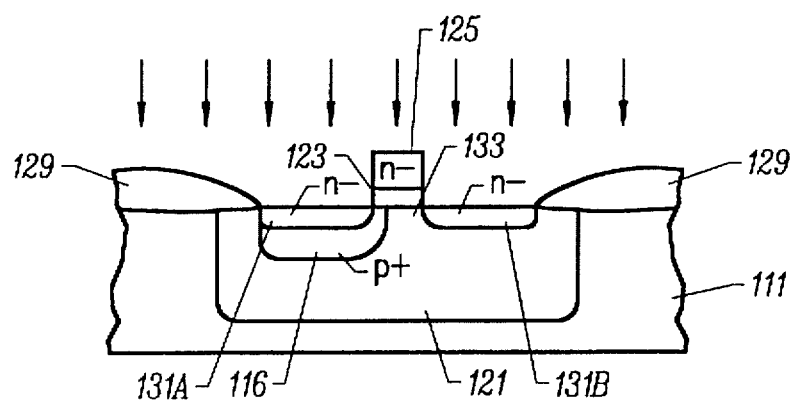

Next as shown in FIG. 4H, the mask 126 is removed and an n-type ion implant is conducted at an ion dose of about $10^{13}$–$10^{14}$ cm$^{-2}$ and an ion kinetic energy of between about 20 and 60 keV with ions selected from P, As, Sb, or Sn. This implant is performed over the entire substrate, penetrating the p-well portion of the apparatus to form two n doped layers 131A and 131B flanking a p-type channel region 133 to the left and right, respectively, within the p-well 121. This implant is intended to form a device's source and drain "tip" regions which extend to the edge of the channel region. As shown, an pocket region 116 remains below the source tip region 131A. In preferred embodiments, the junctions between these tip regions and the adjacent channel region have steep dopant concentration gradients. Thus, subsequent processing should be conducted under conditions which minimize dopant diffusion in these tip regions. To the extent possible, this will generally require conducting subsequent heating steps at relatively low temperatures and for relatively short times, or by using rapid thermal annealing ("RTA") as known in the art.

Figure 4I:
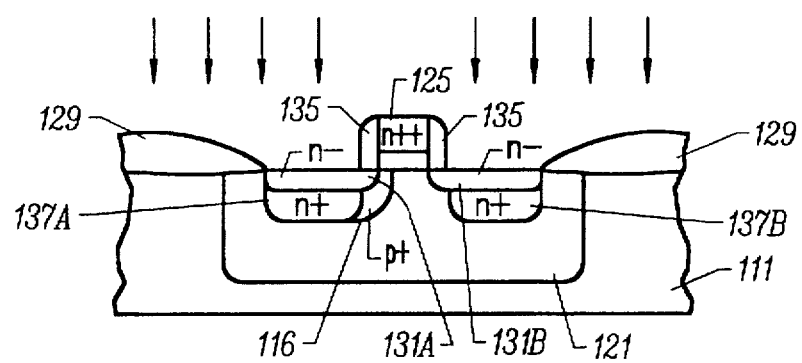

After the tip regions have been formed, "plug" regions 137A and 137B of the source and drain shown in FIG. 4I are optionally formed as follows. To prepare such plug regions, a blanket oxide insulating layer is first deposited over the device. Most of this layer is then anisotropically etched away, leaving side wall insulating spacers 135 of width 0.1–0.3 μm, flanking the polysilicon gate 125 on the right and left as shown in FIG. 4I. Thereafter, an n+ion implant (ion dose=$1\times10^{15}$–$5\times10^{15}$ cm$^{-2}$; ion kinetic energy=50–100 keV; ions selected from P, As, Sb, or Sn) is performed over the substrate, penetrating the p-well portion of the structure. This produces drain and source plug regions 137A and 137B of increased n-type doping. As can be seen in FIG. 4I, after the plug regions of the source and drain are formed, a pocket region 116 remains around source tip 131A and extending into a portion of the channel region. After drain and source layers 137A and 137B have been formed, an anneal step is performed. In preferred embodiments, only this anneal step (and no others) are conducted after the asymmetric halo, tip, and plug implants. In other words, no anneal step is performed between when the asymmetric halo implant is performed and when the plugs implant is performed. This limited annealing allows the halo and tip regions to maintain relatively steep concentration gradients near the channel region.

Figure 4J:
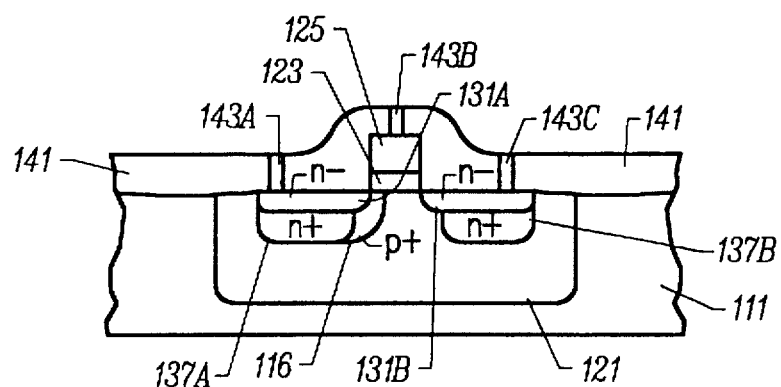

After the source and drain regions have been formed, an insulating layer 141 is formed over the device as shown in FIG. 4J. Apertures or vias 143A, 143B, and 143C are then selectively etched in the oxide layer 141 and filled with metal, such as aluminum, tungsten, titanium or other electrically conductive material to provide electrical contacts for the drain 131A, gate 125, and source 131B. In addition, a pocket aperture (not shown) is provided over the pocket extention 82 (FIG. 2). This aperture is filled with a conductive metal to form the pocket tie 80 at the same time that electrical contacts are formed for drain 131A, gate 125, and source 131B.

Various techniques are available for forming the electrical contacts/ties. In one approach, after the apertures/vias have been formed, a titanium (Ti) layer is conformally deposited over the structure. Thereafter, a titanium nitride (TiN) layer is conformally deposited over Ti layer. Next, the MOS device is subjected to a rapid thermal anneal (RTA) step to cause some Ti from the Ti layer to diffuse into the source, drain, gate, and pocket regions and form a titanium silicide ohmic contacts.

Following the RTA, a blanket layer of tungsten (W) is deposited over the partially fabricated chip at a temperature of typically about 450° C. followed by an etchback process removing all the blanket W layer except a plug in the aperture. Next, a second TiN barrier layer is deposited over the tungsten filled vias. At this point, the upper surface of the structure is relatively flat and contains no unfilled vias. On this surface, an aluminum metallization layer is now deposited, overlying the second barrier layer. This layer is subsequently patterned to connect the vertical ties with horizontal conductive lines such as those that control the potential of the pocket region 116.

Further details of and variations on the above processes are presented in U.S. patent application Ser. No. 08/357,436 which was previously incorporated herein by reference.

Conclusion

Although certain preferred embodiments of the present invention have been described, it should be understood that the present invention may be embodied in many other specific forms without departing from the spirit or scope of the invention. Particularly, the NFETs illustrated above can be replaced with PFETs. Further, the devices of this invention can be implemented in an SOI (silicon on insulator) structure rather than the bulk-silicon-based structure described above. Still further, the devices of this invention may be operated over a wide range of temperatures. At low temperatures, the mean free path of electrons in silicon increases so that more current will be in the form of ballistic transport at low temperatures. Therefore, the present examples are to be considered as illustrative and not restrictive, and the invention is not to be limited to the details given herein, but may be modified within the scope of the appended claims.

What is claimed is:

1. An asymmetric MOS device provided in a semiconductor substrate and having an adjustable threshold voltage, the MOS device comprising:

a bulk region of a first conductivity type, the bulk region having a concentration of dopant atoms of the first conductivity type;

source and drain regions positioned within said bulk region and separated by a channel region, the source and drain regions being of a second conductivity type;

a gate positioned over the channel region;

a pocket region of the first conductivity type, the pocket region abutting one of said source or drain regions and proximate said channel region, the pocket region also having a concentration of dopant atoms of the first conductivity type which concentration is greater than the bulk region's concentration of dopant atoms and the channel region's concentration of dopant atoms; and a tie electrically connecting the pocket region to a conductive line, whereby the device's threshold voltage can be adjusted by applying a potential to the conductive line to adjust the pocket region's potential.

2. The asymmetric MOS device of claim 1 wherein the MOS device has an on current and an off current, and wherein the ratio of on current to off current in the MOS device is not greater than about $10^5$.

3. The asymmetric MOS device of claim 2 wherein the device has a gate threshold voltage of at most about ±150 mV.

4. The asymmetric MOS device of claim 1 wherein the pocket region extends into a portion of the channel region.

5. The asymmetric MOS device of claim 4 wherein the portion of the channel region outside the pocket region has a concentration of dopant atoms of the first conductivity type of at most about $1\times10^{16}$ cm$^{-3}$.

6. The asymmetric MOS device of claim 5 wherein the concentration of dopant atoms of the first conductivity type in the channel region outside the pocket region is between about $1\times10^{14}$ and $1\times10^{16}$ cm$^{-3}$.

7. The asymmetric MOS device of claim 1 wherein the channel region includes counterdopant of the second conductivity type.

8. The asymmetric MOS device of claim 7 wherein the counterdopant is provided in a concentration of between about $10^{16}$ and $10^{18}$ cm$^{-3}$.

9. The asymmetric MOS device of claim 7 wherein at least a portion of the channel region is of the second conductivity type.

10. The asymmetric MOS device of claim 1 wherein the dopant concentration in the pocket region is at least about $1\times10^{16}$ cm$^{-3}$.

11. The asymmetric MOS device of claim 10 wherein the dopant concentration in the pocket region is between about $1\times10^{17}$ and $1\times10^{18}$ cm$^{-3}$.

12. The asymmetric MOS device of claim 1 wherein said pocket region is located under at least part of one of said source and drain regions, and said pocket region does not extend into or under said channel region.

13. The asymmetric MOS device of claim 1 wherein said pocket region is located under at least part of one of said source and drain regions, and said pocket region extends under a part of said channel region adjacent said source or drain region.

14. A connected group of asymmetric MOS devices provided in a semiconductor substrate and having adjustable threshold voltages, the connected group comprising:

(a) a plurality of asymmetric MOS devices, each including:

a bulk region of a first conductivity type, the bulk region having a concentration of dopant atoms of the first conductivity type, source and drain regions positioned within said bulk region and separated by a channel region, the source and drain regions being of a second conductivity type, a gate positioned over the channel region, and a pocket region of the first conductivity type, the pocket region abutting one of said source or drain regions and proximate said channel region, the pocket region also having a concentration of dopant atoms of the first conductivity type which concentration is greater than the bulk region's concentration of dopant atoms; and (b) a conductive path of the first conductivity type electrically connecting pocket regions of each asymmetric MOS device in the connected group, whereby the devices' threshold voltages can be simultaneously adjusted by applying a potential to the conductive path to adjust the pocket regions' potentials.

15. The connected group of asymmetric MOS devices of claim 14 wherein the conductive path is provided in the semiconductor substrate.

16. The connected group of asymmetric MOS devices of claim 15 wherein the conductive path has a concentration of dopant atoms of the first conductivity type which concentration is greater than the bulk region's concentration of dopant atoms.

17. The connected group of asymmetric MOS devices of claim 15 further comprising a tie electrically connecting the conductive path to a conductive line disposed above the pocket region.

18. The connected group of asymmetric MOS devices of claim 14 wherein each MOS device has an on current and an off current, and wherein the ratio of on current to off current in the MOS devices is not greater than about $10^5$.

19. The connected group of asymmetric MOS devices of claim 15 wherein the device has a gate threshold voltage of at most about ±150 mV.

20. The connected group of asymmetric MOS devices of claim 14 wherein the pocket region extends into a portion of the channel region.

21. The connected group of asymmetric MOS devices of claim 14 wherein the channel region includes counterdopant of the second conductivity type.

22. The connected group of asymmetric MOS devices of claim 21 wherein at least a portion of the channel region is of the second conductivity type.

23. The asymmetric MOS device of claim 1 further comprising circuitry coupled to said tie, said circuitry configured to independently control potential between said pocket region and said source region, and thereby adjust the threshold voltage of said MOS by back-biasing.

* * * * *